United States Patent [19]
Gardner et al.

[11] Patent Number: 6,140,191
[45] Date of Patent: Oct. 31, 2000

[54] METHOD OF MAKING HIGH PERFORMANCE MOSFET WITH INTEGRATED SIMULTANEOUS FORMATION OF SOURCE/DRAIN AND GATE REGIONS

[75] Inventors: Mark I. Gardner, Cedar Creek; Mark C. Gilmer; Robert Paiz, both of Austin, all of Tex.

[73] Assignee: Advanced Micro Devices, Inc., Sunnyvale, Calif.

[21] Appl. No.: 09/157,973

[22] Filed: Sep. 21, 1998

[51] Int. Cl.[7] .................................................. H01L 21/336
[52] U.S. Cl. .......................... 438/300; 438/180; 438/299
[58] Field of Search .................................... 438/300, 301, 438/180, 181, 182; 437/40; 257/332, 401, 618

[56] References Cited

U.S. PATENT DOCUMENTS 5,552,331  9/1996  Hsu et al. ................................. 437/40
5,955,759  9/1999  Ismail et al. ............................. 257/332

OTHER PUBLICATIONS

Stanley Wolf and Richard N. Tauber; *Silicon Processing for the VLSI Era, Volume 2—Process Integration*; pp. 144–152, 316–3191 392–400 and 434–435; 1990.

Stanley Wolf and Richard N. Tauber; *Silicon Processing for the VLSI Era, Volume 3—The Submicron MOSFET*; pp. 421–423 and 641; 1995.

*Primary Examiner*—Amir Zarabian
*Assistant Examiner*—Bradley K Smith
*Attorney, Agent, or Firm*—Timothy M. Honeycutt

[57] ABSTRACT

An integrated circuit and a method of making a transistor thereof are provided. The method includes the steps of forming a first stack on the substrate and a second stack on substrate in spaced-apart relation to the first stack, where the first stack has a first layer and first and second spacers adjacent to the first layer and the second stack has a second layer and third and fourth spacers adjacent to the second layer. A gate dielectric layer is formed on the substrate between the first and second stacks and a first conductor layer is formed on the gate dielectric layer. A first source/drain region is formed beneath the first conductor layer and a second source/drain region is formed beneath the second conductor layer. The first and second layers are removed and a first contact is formed on the first source/drain region and a second contact is formed on the second source/drain region. The method integrates gate and source/drain region formation and provides for gate electrodes with work functions tailored for n-channel and p-channel devices.

27 Claims, 6 Drawing Sheets

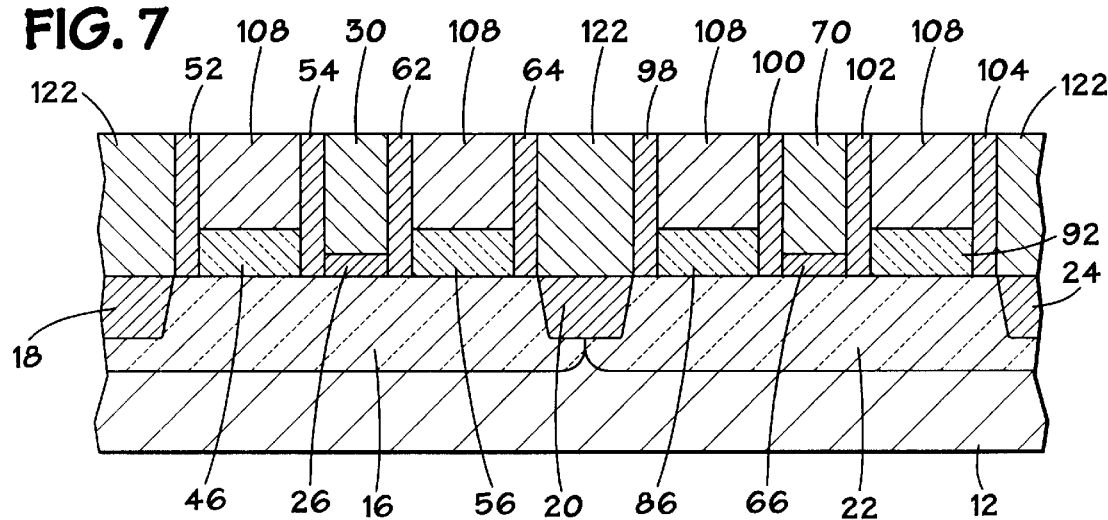
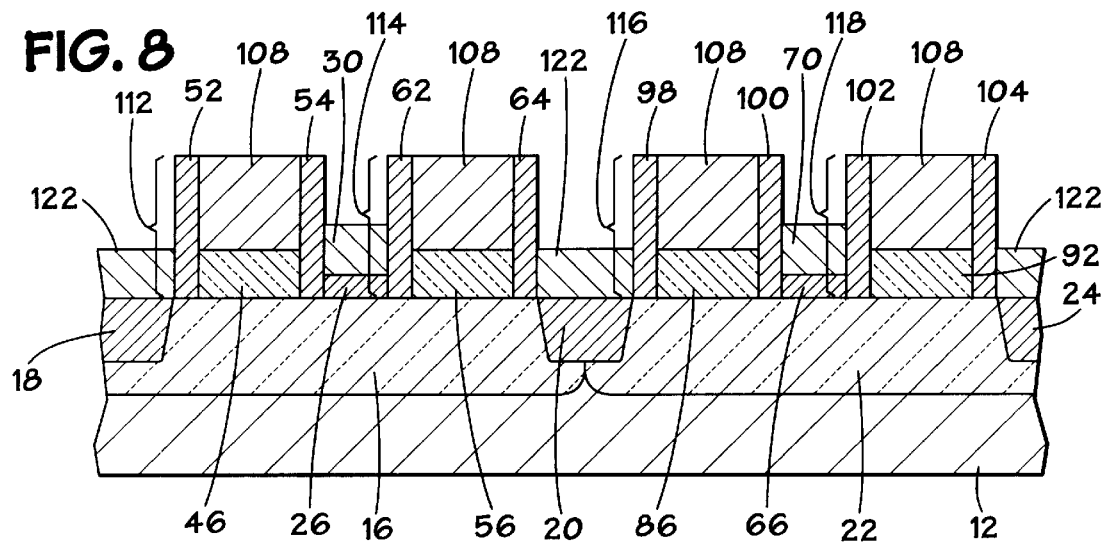
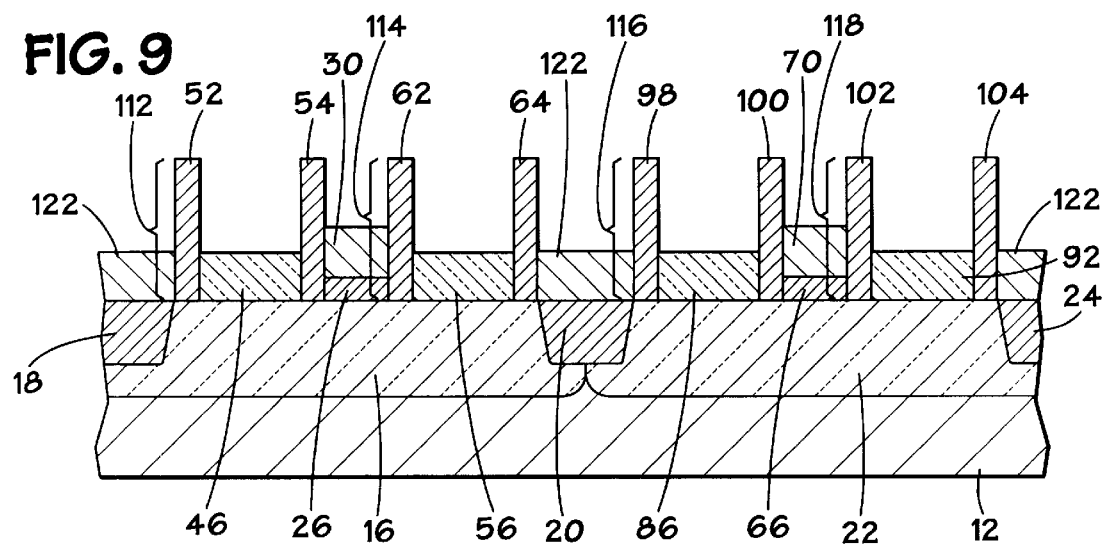

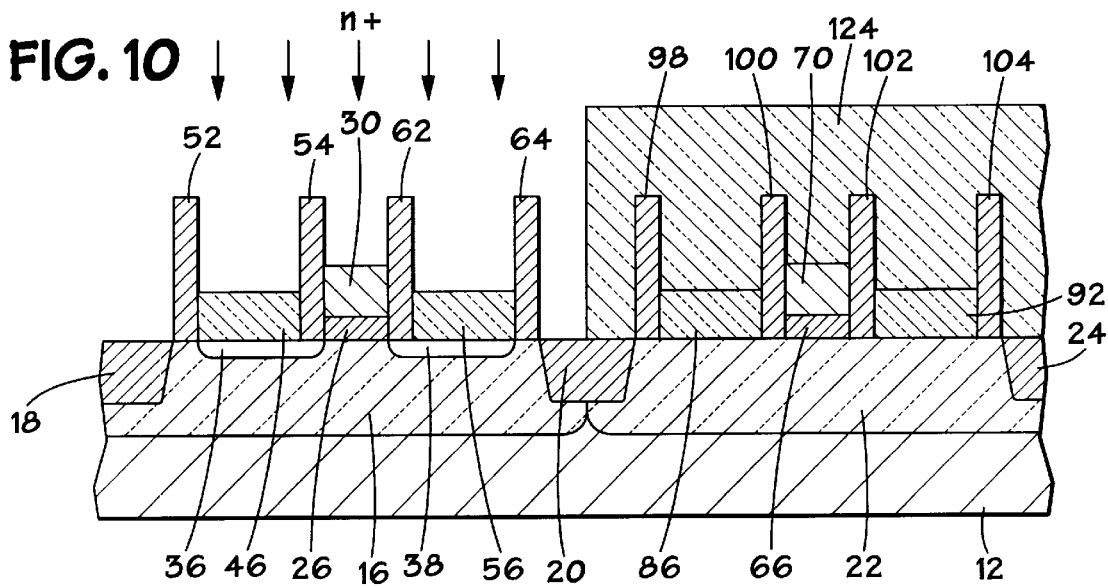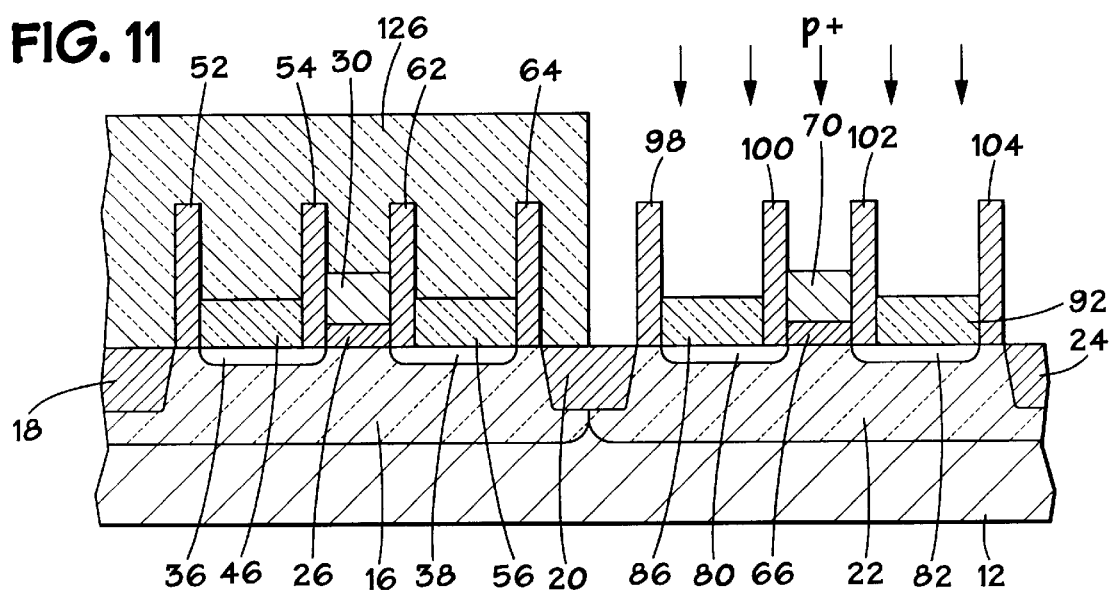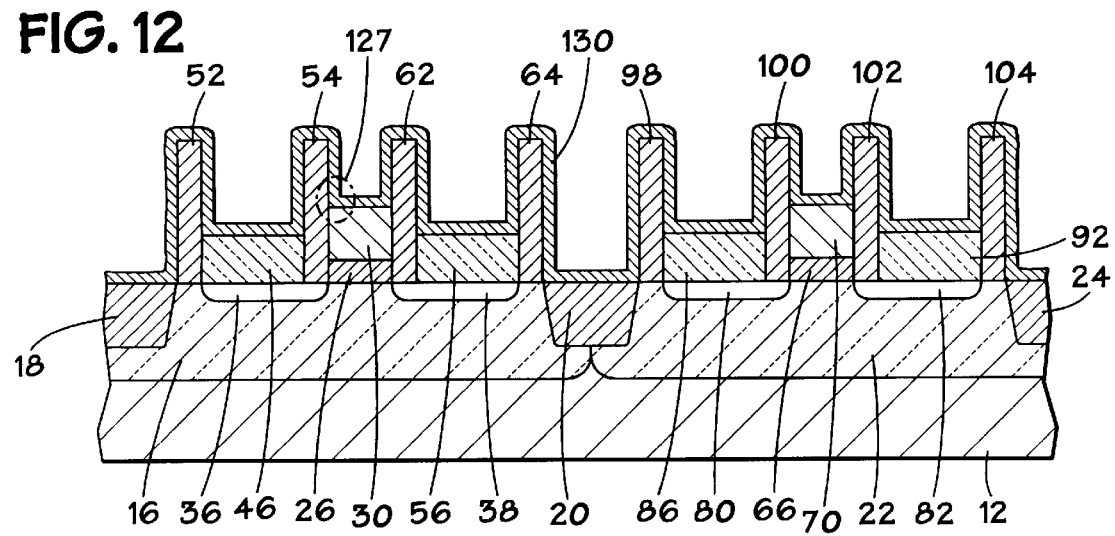

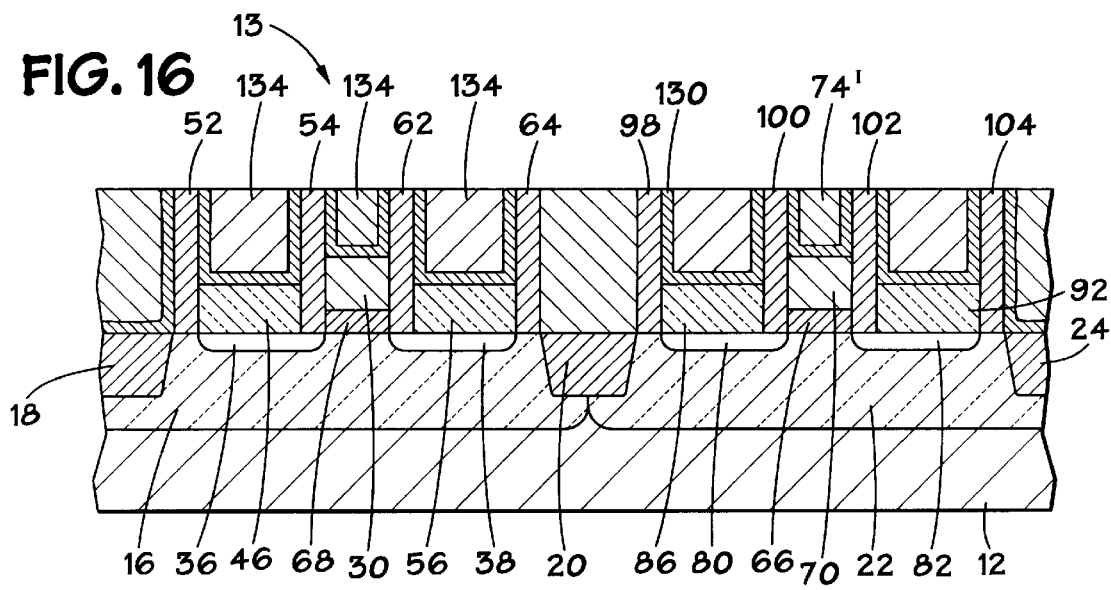
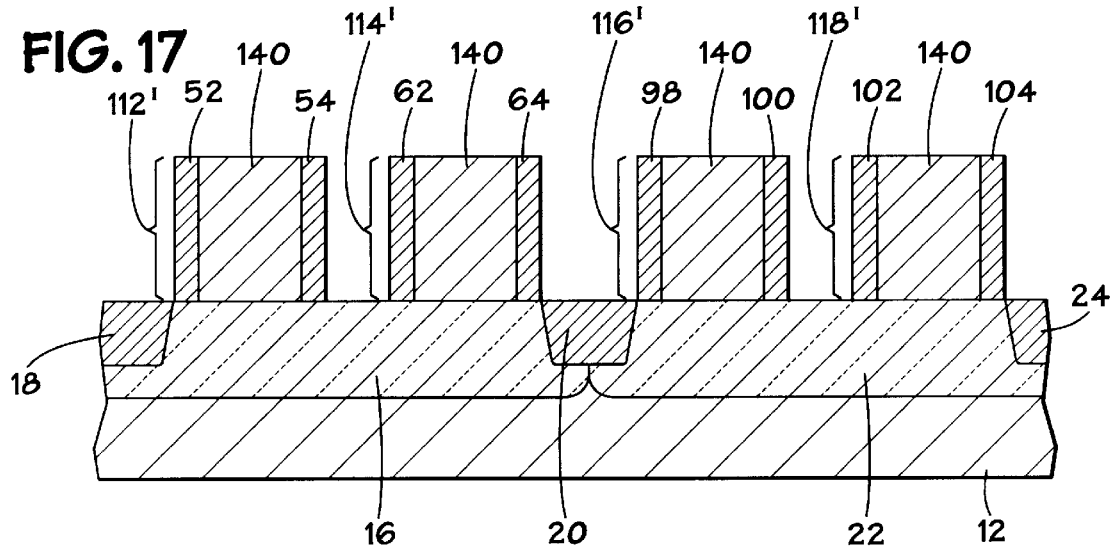
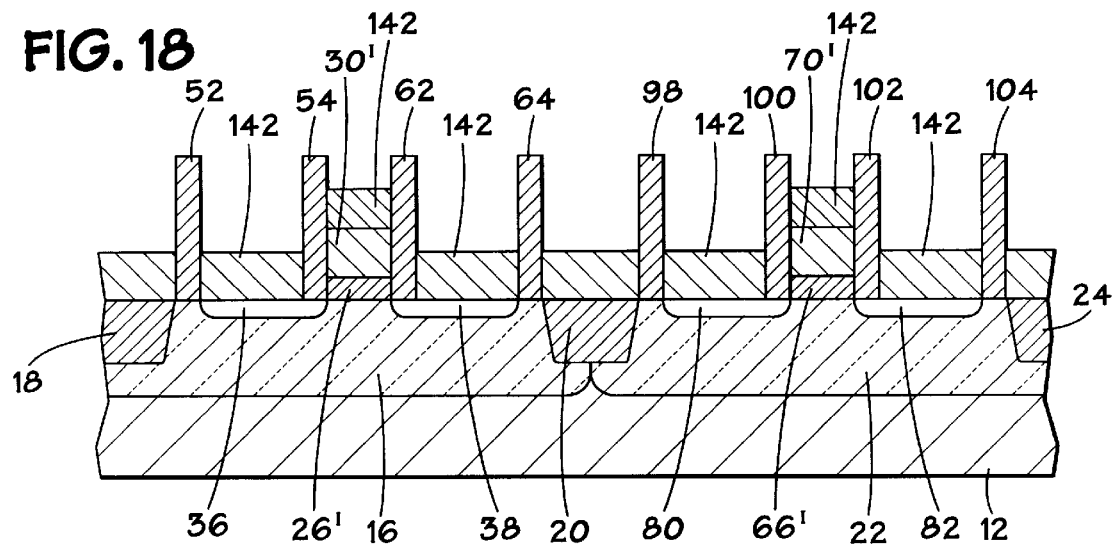

METHOD OF MAKING HIGH PERFORMANCE MOSFET WITH INTEGRATED SIMULTANEOUS FORMATION OF SOURCE/DRAIN AND GATE REGIONS

BACKGROUND OF THE INVENTION

1. Field of the Invention

This invention relates generally to semiconductor processing, and more particularly, to an integrated circuit with transistors, and to a method of making the same integrating gate and source/drain formation.

2. Description of the Related Art

A typical field effect transistor implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. The first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

Early MOS integrated circuits were implemented as p-channel enhancement mode devices using aluminum as the gate electrode material. Aluminum had the advantages of relatively low resistivity and material cost. Furthermore, there was already a large body of manufacturing experience with aluminum in the chip industry developed from bipolar integrated circuit processing.

A later process innovation that is still widely used today, involves the use of heavily doped polysilicon as a gate electrode material in place of aluminum. The switch to polysilicon as a gate electrode material was the result of certain disadvantages associated with aluminum in early fabrication technologies. In conventional semiconductor fabrication processing, aluminum must be deposited following completion of all high temperature process steps (including drive-in of the source and drain regions). As a result, an aluminum gate electrode must ordinarily be separately aligned to the source and drain. This alignment procedure can adversely affect both packing density and parasitic overlap capacitances between the gate and source/drain regions. In contrast, polysilicon with its much higher melting point, can be deposited prior to source and drain formation and therefore provide for self-aligned gate processing. Furthermore, the high temperature capability of polysilicon is routinely exploited to enable interlevel dielectric layers to be applied to provide multiple metallization layers with improved planarity.

Despite the several advantages of polysilicon over aluminum as a gate electrode material, polysilicon has the disadvantage of a much higher resistivity as compared to aluminum. Higher resistivity translates into higher values of interconnect line resistance that can lead to undesirably long RC time constants and DC voltage variations within VLSI or ULSI circuits. The development of polycide films on top of polysilicon layers has alleviated some of the resistivity shortcomings of polysilicon gate electrodes. However, the resistivity of polysilicon gate electrodes in conventional MOS integrated circuit processing still presents a potential impediment to successful process scaling through reductions in the operating voltages of VLSI and ULSI devices.

Another disadvantage of polysilicon as a gate electrode material is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion.

Still another potential shortcoming of conventional gate electrode formation, particularly in CMOS circuits, is asymmetrical threshold voltages for n-channel and p-channel devices. For optimal logic gate performance, the threshold voltages of n-channel and p-channel devices in a CMOS circuit should have comparable magnitudes. In addition, it is desirable to keep threshold voltages for both types of devices as small as possible in order to minimize subthreshold currents and needless power consumption. Conventional process flows have incorporated various combinations of $n^+$ or $p^+$ polysilicon gate electrodes for n-channel and p-channel devices. For n-channel devices incorporating $n^+$ polysilicon gate electrodes, the work function of $n^+$ polysilicon is ideal, and will yield threshold voltages of less than about 0.7 volts for common values of channel doping and oxide thicknesses. However, where $n^+$ polysilicon is used as the gate electrode for a p-channel device, proper control of threshold voltage is more difficult since the threshold voltage of the p-channel device is already more negative than −0.7 volts, particularly in the doping range of $10^{15}$ to $10^{17}$ cm$^{-3}$.

A boron implant is commonly used to adjust the threshold voltage of p-channel as well as n-channel devices in CMOS circuits with $n^+$ polysilicon gates. This approach has been widely used in semiconductor processing but requires careful tailoring of the background dopings of the substrate and the well in view of the parameters for the threshold voltage control implant. The requisite tying of these various parameters represents processing complexity and a limitation on the flexibility of a given process flow.

Another approach in CMOS processing has involved a dual-doped polysilicon process in which $n^+$ polysilicon is used as the gate electrode material for n-channel devices and $p^+$ polysilicon is used as a gate electrode material for p-channel devices. Such a dual doped approach can lead to difficulties when interconnection is made between the n+ and p+ polysilicon gate electrodes, such as when the two transistors are used to construct an inverter. The interconnect between the n+ and p+ polysilicon gates is frequently made via a silicide local interconnect strap that provides a diffusion pathway for the p and n-type dopants of the two gates. During subsequent high temperature steps the migrating p and n-type dopants may counterdope the respective gate electrodes and significantly degrade the performance of the transistors.

The present invention is directed to overcoming or reducing the effects of one or more of the foregoing disadvantages.

SUMMARY OF THE INVENTION

In accordance with one aspect of the present invention, a method of fabricating a transistor on a substrate is provided that includes the step of forming a first stack on the substrate and a second stack on substrate in spaced-apart relation to the first stack, where the first stack has a first layer and first and second spacers adjacent to the first layer and the second stack has a second layer and third and fourth spacers adjacent to the second layer. A gate dielectric layer is formed on the substrate between the first and second stacks and a first conductor layer is formed on the gate dielectric layer. A first source/drain region is formed beneath the first conductor layer and a second source/drain region is formed beneath the second conductor layer. The first and second layers are removed and a first contact is formed on the first source/drain region and a second contact is formed on the second source/drain region.

In accordance with another aspect of the present invention, a method of fabricating a transistor on a substrate is provided. The method includes the step of forming a first stack on the substrate and a second stack on the substrate in spaced-apart relation to the first stack where the first stack has a first conductor layer on the substrate, a second layer on the first conductor layer and first and second spacers adjacent the first conductor layer and the second layer, and the second stack has a second conductor layer on the substrate, a third layer on the second conductor layer and third and fourth spacers adjacent the second conductor layer and the third layer. A gate dielectric layer is formed on the substrate between the first and second stacks. A third conductor layer is formed on the gate dielectric layer. A first source/drain region is formed beneath the first conductor layer and a second source/drain region is formed beneath the second conductor layer. The second and third layers are removed and a fourth conductor layer is formed on the first, second and third conductor layers.

In accordance with another aspect of the present invention, an integrated circuit is provided that includes a substrate and a plurality of transistors. Each of the plurality of transistors has a gate dielectric layer on the substrate, a gate electrode on the gate dielectric layer, first and second source/drain regions in the substrate, a first contact on the first source/drain region, and a second contact on the second source/drain region, the first contact having a first spacer adjacent to the gate electrode and a second spacer, the second contact having a third spacer adjacent to the gate electrode opposite to the first spacer, and a fourth spacer.

BRIEF DESCRIPTION OF THE DRAWINGS

The foregoing and other advantages of the invention will become apparent upon reading the following detailed description and upon reference to the drawings in which: with the present invention;

FIG. 7 is a cross-sectional view like FIG. 6 depicting planarization of the gate electrode layers in accordance with the present invention;

FIG. 8 is a cross-sectional view like FIG. 7 depicting removal of a portion of the gate electrode layers in accordance with the present invention;

FIG. 9 is a cross-sectional view like FIG. 8 depicting removal of the upper portions of the stacks in accordance with the present invention;

FIG. 10 is a cross-sectional view like FIG. 9 depicting source/drain implant of one of the two transistors in accordance with the present invention;

FIG. 11 is a cross-sectional view like FIG. 10 depicting source/drain implant of the other of the two transistors in accordance with the present invention;

FIG. 12 is a cross-sectional view like FIG. 11 depicting deposition of silicide-forming and adhesion layers in accordance with the present invention;

FIG. 16 is a cross-sectional view like FIG. 15 depicting planarization of the two contact layers in accordance with the present invention;

FIG. 17 is a cross-sectional view like FIG. 5, but depicting an alternate exemplary process flow incorporating a different stack arrangement in accordance with the present invention; and FIG. 18 is a cross-sectional view like FIG. 17, but depicting removal of a portion of the alternate stacks in accordance with the present invention.

DETAILED DESCRIPTION OF SPECIFIC EMBODIMENTS

Figure 1:
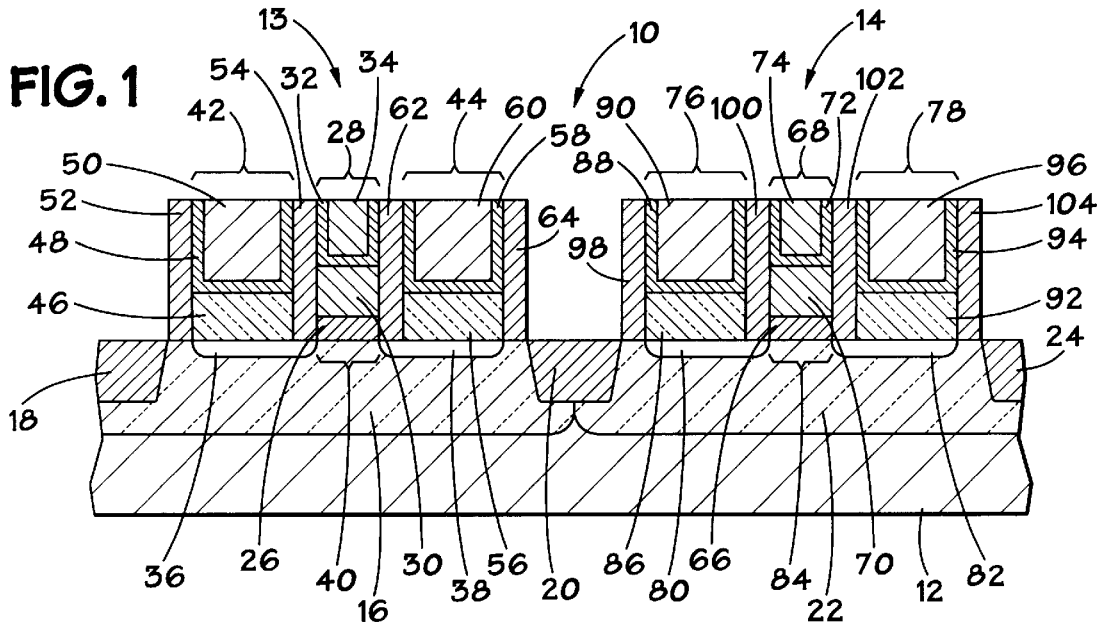
FIG. 1 is a cross-sectional view of an exemplary embodiment of an integrated circuit transistor including first and second transistors in accordance with the present invention.

In the drawings described below, reference numerals are generally repeated where identical elements appear in more than one figure. Turning now to the drawings, and in particular to FIG. 1, there is shown a cross-sectional view of an exemplary embodiment of an integrated circuit 10 formed on a semiconductor substrate 12. The semiconductor substrate 12 may be composed of n-doped, or p-doped silicon, silicon-on-insulator, or other suitable substrate materials. The integrated circuit 10 includes a plurality of transistors, two of which are shown and designated 13 and 14. The transistor 13 is positioned over a well 16 formed in the substrate 12 and is electrically isolated from the transistor 14 and from other structures in the substrate 12 by isolation structures 18 and 20. The transistor 14 is similarly positioned over a well 22 formed in the substrate 12 and is electrically isolated from the transistor 13 and other structures in the substrate 12 by the isolation structure 20 and by a similar isolation structure 24.

The transistor 13 includes a gate dielectric layer 26 formed on the substrate 12 and a gate electrode 28 formed on the gate dielectric layer 26. The gate electrode 28 includes a conductor layer 30, an adhesion layer 32 and a conductor layer 34 formed on the adhesion layer 32. The transistor 13 is provided with source/drain regions 36 and 38 in the substrate 12 that are laterally separated to define a channel region 40 beneath the gate dielectric layer 26. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization. Contacts 42 and 44 are respectively positioned over the source/drain regions 36 and 38. The contact 42 includes a conductor layer 46 formed on the source/drain region 36, an adhesion layer 48, and a conductor layer 50 formed on the adhesion layer 58. The contact 42 is sandwiched between side-by-side insulating spacers 52 and 54. The spacer 54 is positioned adjacent to the gate electrode 28. The contact 44 is provided with substantially identical conductor, adhesive, and conductor layers 56, 58 and 60 and is sandwiched between substantially identical spacers 62 and 64. The spacer 62 is positioned adjacent to the gate electrode 28 opposite the spacer 54.

Like the transistor 13, the transistor 14 is provided with a gate dielectric layer 66 and a gate electrode 68 formed thereon and including a conductor layer 70, an adhesion layer 72 and a conductor layer 74. Contacts 76 and 78 are positioned over source/drain regions 80 and 82 formed in the substrate 12. The lateral separation of the source/drain regions 80 and 82 defines a channel region 84 for the transistor 14. Like the contacts 42 and 44, the contact 76 includes a conductor layer 86, an adhesion layer 88 and a conductor layer 90. Similarly, the contact 78 includes a conductor layer 92, an adhesion layer 94 and a conductor layer 96. The contact 76 is sandwiched between spacers 98 and 100 and the contact 78 is sandwiched between spacers 102 and 104.

Figure 2:
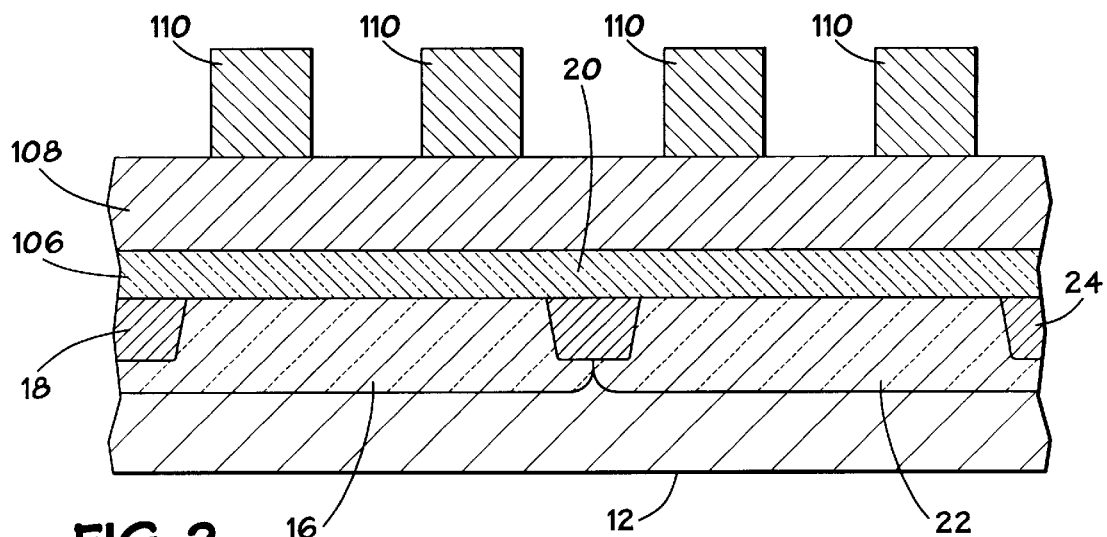
FIG. 2 is a cross-sectional view of a semiconductor substrate depicting initial definition of contact stacks for the transistors in accordance with the present invention.

An exemplary process flow for forming the transistors 13 and 14 depicted in FIG. 1 may be understood by referring now to FIGS. 2–14, and initially to FIG. 2. The process flow will be described in the context of CMOS device processing. However, the skilled artisan will appreciate that the transistors transistor 14 may be implemented as n-channel, p-channel or other types of devices. Initially, the wells 16 and 22 are established in the substrate 12 by ion implantation or diffusion as desired. The wells 16 and 22 may be twin, twin retrograde, or similar suitable wells, and are formed in the substrate 12 by using well known techniques involving the alternative masking and ion implantation of the regions between the isolation trenches 18 and 20 and 20 and 24 using dopants of opposite conductivity type for each well.

Following the implants, the substrate 12 is annealed to drive the wells 16 and 22 to the desired depth. The skilled artisan will appreciate that the parameters for the well implants and the anneal process will depend on the initial doping level of the substrate, and the design rules for the fabrication process used.

The isolation structures 18, 20 and 24 may be shallow trench isolation, field oxide, or other isolation structures. In an exemplary embodiment, the structure 18, 20 and 24 are shallow trench isolation structures and may be composed of silicon dioxide, tetra-ethyl-orthosilicate ("TEOS") or other suitable isolation materials and may be formed using well known damascene etching and fill techniques.

Layers 106 and 108 are successively formed on the substrate 12 and masked with photoresist 110. As used herein, the terms "formed on" or "disposed on" should be construed to include the possibility that a given layer may be formed on another given layer with a third or other intervening layers disposed between the two. Through subsequent processing, the layers 106 and 108 will be patterned to define stacks used for, among other things, the formation of the spacers 52, 54, 62, 64, 98, 100, 102 and 104. In addition, the layer 106 will provide the source material for the conductor layers 46, 56, 86 and 92 shown in FIG. 1. The layer 106 is advantageously composed of a silicide forming material that will provide enhanced ohmic contact with the source/drain regions 36, 38, 80 and 82. Exemplary materials include titanium, cobalt, platinum, palladium, nickel, tungsten, tantalum, molybdenum, or the like, and may be applied by CVD, sputter or like techniques. In an exemplary embodiment, the layer 106 is composed of titanium and may be applied by CVD to a thickness of about 200 to 500 Å and advantageously to about 300 Å.

The function of the layer 108 is primarily to establish temporary structure to facilitate the later formation of the spacers 52, 54, 98, 100, 102 and 104. Accordingly, the layer 106 may be composed of a great variety of materials, such as silicon dioxide, silicon nitride, silicon oxynitride, TEOS, tungsten, tantalum, titanium or the like. In an exemplary embodiment, the layer 108 is composed of tungsten and may be deposited using well known CVD techniques such as silane reduction. In an exemplary embodiment, the layer 108 may have a thickness of about 1500 to 3000 Å and is advantageously about 2000 Å thick.

Figure 3:
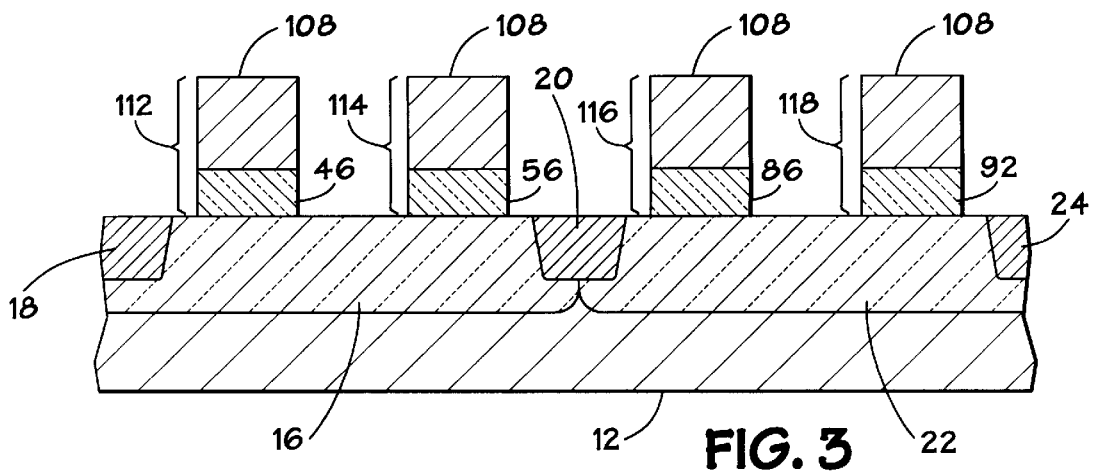
FIG. 3 is a cross-sectional view like FIG. 2 following definition of the stacks in accordance with the present invention.

Referring now to FIG. 3, the layers 108 and 106 are anisotropically etched and the patterned photoresist masks 110 are stripped by ashing to yield stacks 112, 114, 116 and 118, where each of the stacks 112, 114, 116 and 118 consists of the defined conductor layers 46, 56, 86 and 92 and the remnants of the previously formed layer 108. The anisotropic etch of the layers 106 and 108 may be by reactive ion etching, chemical plasma etching, or like anisotropic etching techniques. A variety of well known etch chemistries may be used, such as $C_2F_6$ or the like. The width of a given stack, such as the stack 112, will typically be the minimum feature size available with the prevailing lithographic patterning system, although larger geometries are possible. Similarly, the spacing between adjacent stacks, such as the stacks 112 and 114 will typically be the minimum feature size.

Figure 4:
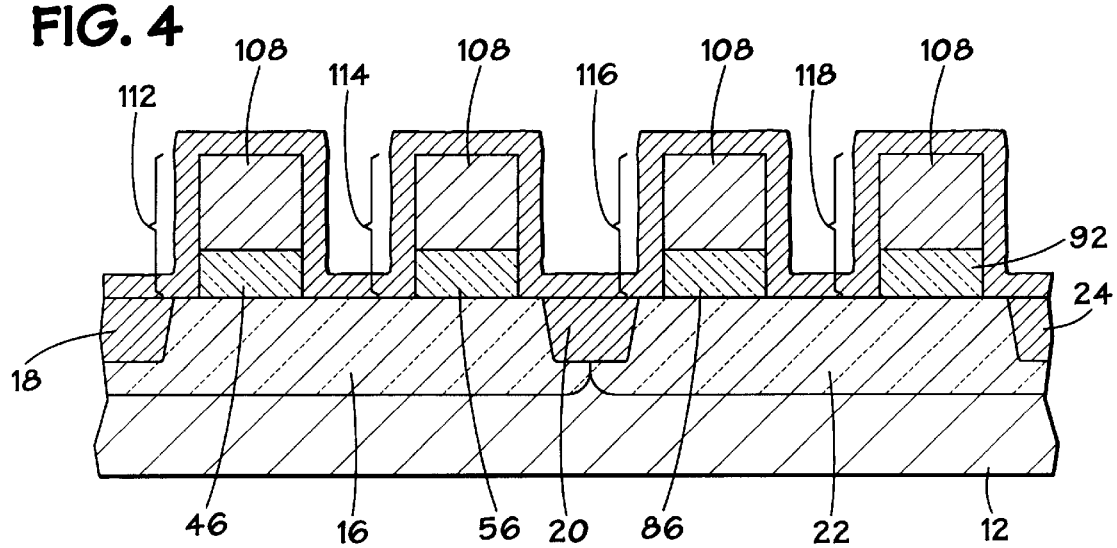
FIG. 4 is a cross-sectional view like FIG. 3 depicting blanket deposition of a spacer material in accordance with the present invention.
Figure 5:
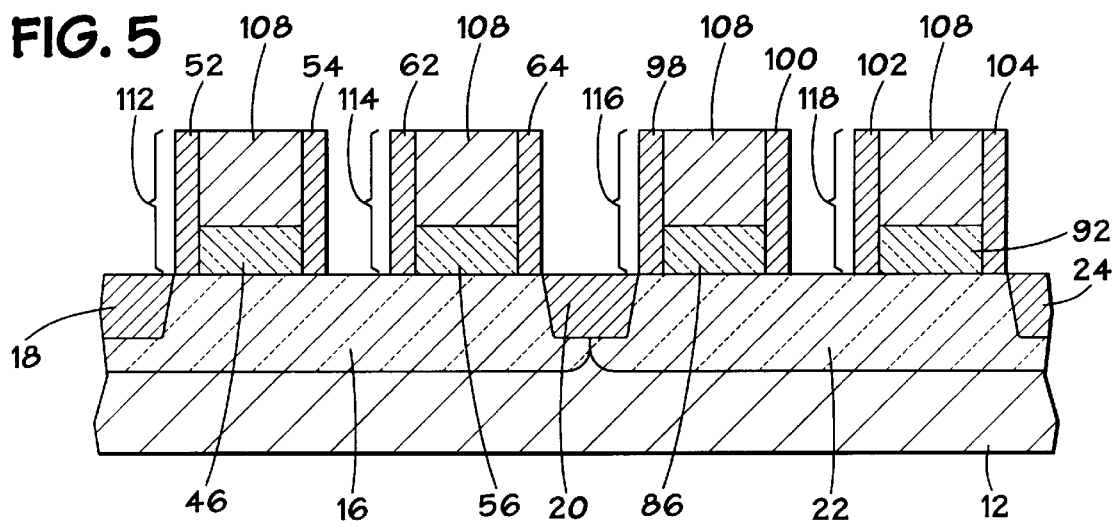
FIG. 5 is a cross-sectional view like FIG. 4 depicting definition of spacers for the stacks in accordance with the present invention.

The formation of the spacers 52, 54, 98, 100, 102 and 104 may be understood by referring now to FIGS. 4 and 5. As shown in FIG. 4, a layer 120 of dielectric material is initially blanket deposited on the substrate 12 and over the stacks 112, 114, 116 and 118. The dielectric layer 120 may be composed of a variety of materials commonly used for dielectric spacers, such as silicon nitride, silicon dioxide, silicon oxynitride, or the like. In an exemplary embodiment, the layer 120 is composed of silicon nitride deposited by CVD to a thickness of about 20 to 100 Å and advantageously to about 60 Å. Following deposition, the layer 120 is anisotropically etched to yield the spacers 52, 54, 98, 100, 102 and 104 as shown in FIG. 5. Again, the etch may be by reactive ion etching, chemical plasma etching, or other suitable anisotropic etching techniques utilizing a chemistry suitable for anisotropically etching silicon nitride, such as $C_3F_8$. The deposition and etch steps yield spacers 52, 54, 98, 100, 102 and 104 with relatively thin widths, on the order of 60 Å.

The fabrication of the spacers 52, 54, 98, 100, 102 and 104 simultaneously sets the positions and lateral dimensions of the source/drain regions 36, 38, 80 and 82 and the gate electrodes 28 and 68 (see FIG. 1) that will be formed during later processing. This concept may be understood by focusing momentarily on the source/drain region 36 and the gate electrode 28. The source/drain region 36 will be subsequently formed between the spacers 52 and 54. By fabricating the spacers 52 and 54 in advance of the source/drain region 36, the position and lateral dimension of the portion of the substrate 12 allocated for the source/drain 36 may be preset set by the positioning and the gap between the spacers 52 and 54. The gap may be the minimum feature size for the process technology as described above. Likewise, the gate electrode 28 is positioned between the spacers 54 and 62. The position and lateral dimension of the portion of the substrate 12 allocated for the gate electrode 28 is again set by the positioning and the gap between the spacers 54 and 62. The gap may also be the minimum feature size. This integration of the gate electrode and source/drain region definition enables better control of chip area and ultimately tighter packing density.

Figure 6:
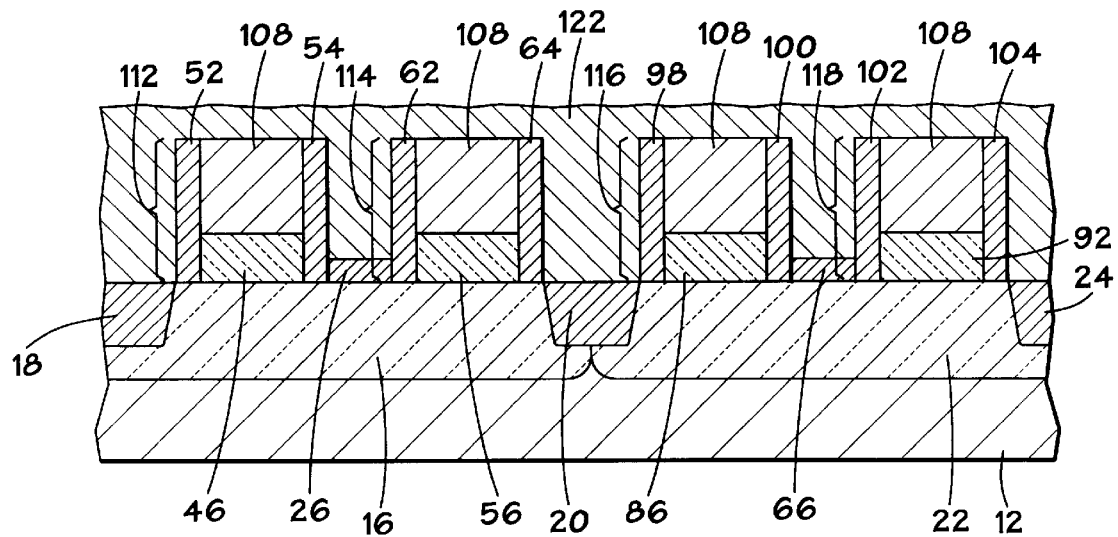
FIG. 6 is a cross-sectional view like FIG. 5 depicting formation of gate dielectric and gate electrode layers in accordance with the present invention.

The fabrication of the gate dielectric layers 26 and 68, and conductor layers 30 and 70 of the transistors transistor 14 shown in FIG. 1 may be understood by referring now to FIGS. 6 and 7. As shown is FIG. 6, the gate dielectric layers 26 and 68 are formed on the substrate 12. Layers 26 and 68 may be formed by thermal oxidation or chemical vapor deposition. In an exemplary embodiment, the layers 26 and 68 are formed by oxidizing the substrate 12 in an oxygen containing ambient at about 800 to 1000° C. for about 10 to 30 seconds in a rapid thermal anneal process that establishes the gate dielectric layers with a thickness of about 15 to 100 Å and advantageously about 40 Å. A furnace process may be used in lieu of a RTA, using the same temperature range for about 10 to 30 minutes. Following formation of the gate dielectric layers 26 and 68, a layer of polysilicon 122 is deposited over the substrate conformally coating the stacks 112, 114, 116 and 118 and filling the gaps between opposing spacers 54 and 62 and 100 and 102. As shown in FIG. 7, the polysilicon layer 122 is planarized to the tops of the spacers 52, 54, 98, 100, 102 and 104 by chemical mechanical polishing ("CMP"), etchback planarization, or other like planarization techniques to yield the conductor layers 30 and 70. The conducting material positioned over the isolation structures 18, 20 and 24 may be left in place until later processing or removed at this point by selectively etching the portions of a layer 122 overlying the structures 18, 20 and 24.

In order to obtain a more uniform doping profile through the uniformed conductor layers 30 and 70, the thicknesses of the conductor layers 30 and 70 are reduced by etching as shown in FIG. 8. The etch may be by reactive ion etching chemical plasma etching, or wet etch, or like techniques. The etch need not be anisotropic. The etch reduces the thickness of the layers 30 and 70 by approximately 400 to 800 Å.

The formation of the source/drain regions 36, 38, 80 and 82 may be understood by referring now to FIGS. 9, 10 and 11. As shown in FIG. 9, the top layers 108 of the stacks 112, 114, 116 and 118 are removed, leaving the conductor layers 46, 56, 86 and 92 in place. The removal may be by reactive ion etching, chemical plasma etching or other suitable etch techniques with a chemistry suitable for removable of a particular material involved. In an exemplary embodiment, the layers 108 are composed of tungsten and may be removed using $Cl_2$ alone or in combination with other species as an etch chemistry. Referring now to FIG. 10, the portion of the substrate 12 including the well 22 is masked with photoresist 124 and the source/drain regions 36 and 38 are established in the substrate by forming a $n^+$ implant through the layers 46 and 56. The layers 46 and 56 function as screening layers, enabling the source/drain regions 36 and 38 to be implanted with very shallow junctions. The dopant species may be arsenic, phosphorus, or other suitable n-type dopant. In an exemplary embodiment, the dopant species is arsenic and may be implanted with an energy of about 50 to 150 KeV and a dosage of about 2E15 to 9E15 $cm^{-2}$. The implant angle may be 0°. The n+ implant also establishes the conductivity rendering dopant profile in the poly layer 30. As a result of the prior thinning of the poly layer 30, the dopant distribution through the poly layer 30 after the $n^+$ implant provides a relatively high concentration of dopant throughout the entire width thereof and particularly near the interface with the gate dielectric layer 26.

Referring now also to FIG. 11, the photoresist 124 is stripped by ashing and the portion of the substrate 12 containing the well 16 is masked with a photoresist 126 in anticipation of the formation of the source/drain regions 80 and 82. A p+ implant is performed using a p-type dopant, such as boron, $BF_2$, or other suitable type of p-type dopant. In an exemplary embodiment, the p-type dopant is boron and is implanted with an energy of about 30 to 80 KeV and a dosage of about 2E15 to 9E15 $cm^{-2}$. The implant angle may be 0°. As with the $n^+$ implant, the $p^+$ implant is performed through the layers 86 and 92, which serve as screening layers, enabling establishment of very shallow junctions for the source/drain regions 80 and 82. Similarly, the p+ implant establishes a conductivity rendering dopant concentration in the poly layer 70.

Figure 13:
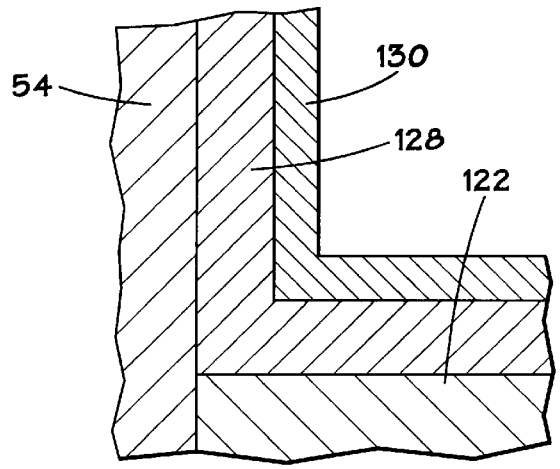
FIG. 13 is a highly magnified view of a portion of FIG. 12 in accordance with the present invention.

The establishment of the contacts 42, 44, 76 and 78 depicted in FIG. 1 may be understood by referring now to FIGS. 11, 12, 13, 14 and 15. FIG. 13 is a highly magnified cross sectional view of the portion of FIG. 12 generally circumscribed by the dashed oval 127. The photoresist 126 depicted in FIG. 11 is stripped by ashing, and as shown in FIGS. 12 and 13, consecutive layers of a silicide forming material 128 and a layer of adhesion material 130 are blanket deposited over the stacks 112, 114, 116 and 118. For simplicity of illustration, the consecutive layers 128 and 130 are depicted as a single conformal layer in FIG. 12. The layer 128 is advantageously composed of a silicide forming material, such as titanium, cobalt, platinum, palladium, nickel, tungsten, tantalum, molybdenum, or the like, and may be applied by CVD, sputter or like techniques. In an exemplary embodiment, the layer 128 is composed of titanium deposited by CVD to a thickness of about 200 to 500 Å and advantageously to about 400 Å.

The layer 130 may be composed of a variety of suitable materials that adhere well to $Si_3N_4$ or $SiO_2$, such as TiN, titanium, a combination of titanium and tungsten, a combination of titanium and TiN, or other suitable adhesion layer materials. In an exemplary embodiment, the layer 130 is composed of TiN. The adhesion layer 130 may be deposited to a thickness of about 100 to 300 Å and advantageously about 150 Å via CVD or the like.

The substrate 12 is subjected to a heating cycle to initiate a silicide forming reaction between the conformally deposited layer 128 and the polysilicon layers 30 and 70 as well as the previously formed silicide forming material layers 46, 56, 86 and 92 and the silicon substrate 12. The time and temperature required for the silicide reaction will depend upon the desired amount of silicide formed and the desired reaction rate. In an exemplary embodiment the substrate 12 may be heated to about 600 to 800° C. for about 10 to 30 minutes. It is anticipated that a large portion of the poly layers 122 will be converted to $TiSi_2$. Similarly, some or all of the layers 46, 56, 86 and 92 may be converted to $TiSi_2$. Following the initial anneal, a second anneal may be performed at about 600 to 700° C. for about 15 seconds to stabilize the silicide. The conclusion of the silicide reaction yields the completed conductor layers 46, 56, 86 and 92 as well as the conductor layers 30 and 70. Each of these layers will consist of either a combination of titanium and polysilicon or silicon, or essentially all $TiSi_2$.

The high temperature steps associated with the silicide forming reaction may be relied upon to anneal and activate the source/drain regions 36, 38, 80 and 82. Alternatively, a separate anneal may be performed by heating the substrate 12 at about 800 to 1000° C. for about 10 to 30 seconds in a RTA process or for about 10 to 30 minutes in a furnace process as desired.

Figure 14:
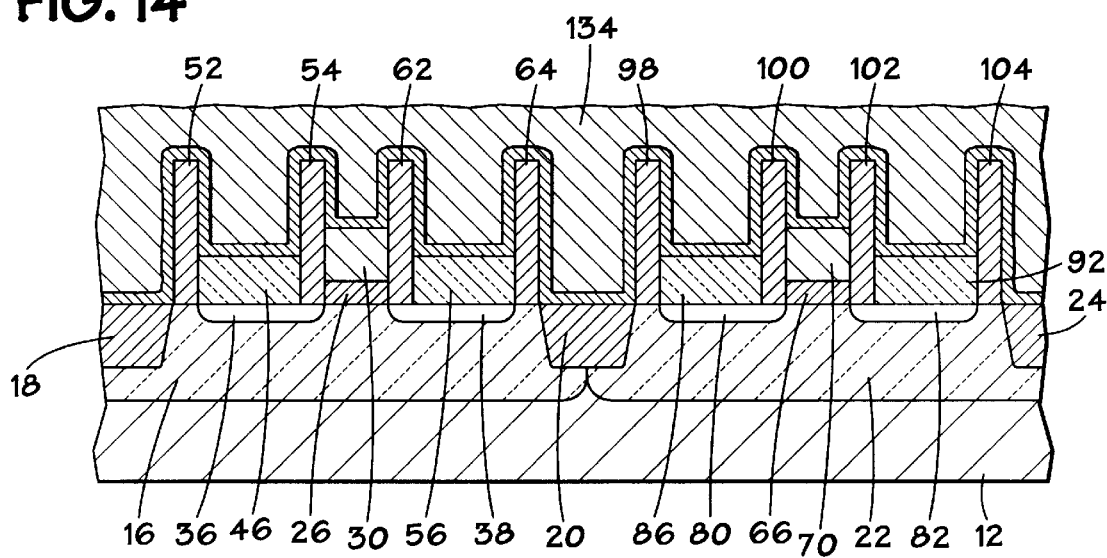
FIG. 14 is a cross-sectional view like FIG. 12 depicting deposition of a contact material in accordance with the present invention.

As shown in FIG. 14, a layer of conducting material 134 is deposited over the adhesion layer 130 and planarized back to the tops of the spacers 52, 54, 98, 100, 102 and 104 to yield the conductor layers 50, 60, 90 and 96, and the completed contacts 42, 44, 76 and 78, as well as the completed transistors 13 and 14 shown in FIG. 1. The layer of conducting material 134 may be composed of a variety of conducting materials, such as tungsten, tantalum, titanium, aluminum, or the like. In an exemplary embodiment, the layer 134 is composed of tungsten. The planarization may be by CMP, etchback planarization, or other suitable planarization techniques. In the illustrated embodiment, the planarization is via CMP. A tungsten gate electrode 16 has the advantages of resistance to high temperature degradation and the elimination of polysilicon depletion that is frequently associated with polysilicon gate electrodes in p-channel devices, and the counterdoping risk associated with $n^+$ and $p^+$ gates. Accordingly, a tungsten gate electrode 16 enables greater flexibility in the thermal budgeting of the overall process flow.

The process in accordance with the present invention provides for the capability to provide the transistors 13 and 14 with gate electrodes of different materials and thus different work functions that are better tailored to the particular devices involved. For example, the transistor 13 may be provided with a conductor layer 34 as shown in FIG. 1 that is composed of tungsten that provides a suitable work function for a n-channel device. Similarly, the transistor 14 may be provided with a conductor layer 74 that, unlike the process flow depicted in FIGS. 2–14, may be composed of a different material than that used for the conductor layer 34. For example, the conductor layer 74 may be composed of tungsten nitride that provides a more suitable work function for a p-channel transistor that will establish more symmetrical threshold voltages for the n-channel and p-channel transistors transistor 14 and will enable the p-channel transistor 14 to function more as a surface control transistor than a conventional p-channel transistor. Better tailoring of the gate work function to the device type is possible than in conventional dual-doped poly processing or even processing involving use of a large work function material for the gates of both n-channel and p-channel devices in a CMOS circuit.

Figure 15:
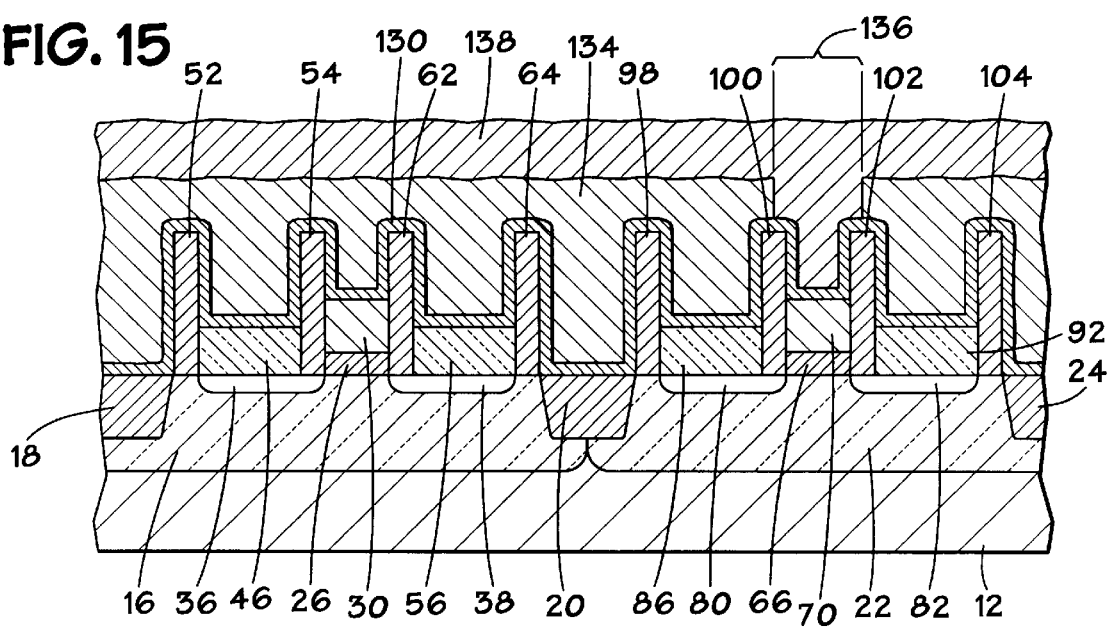
FIG. 15 depicts an alternative exemplary process flow incorporating a different contact deposition process in accordance with the present invention.

An exemplary process flow for forming the transistors transistor 14 with gate electrodes of different work functions may be understood by referring now to FIGS. 14, 15 and 16. The substrate 12 is initially processed as generally described above in relation to FIGS. 2–14 to yield the conductor layer 134. In order to establish a gate electrode material for the transistor 14 with a different work function than that of the conductor layer 134, a via 136 is formed in the conductor layer 134 down to the adhesion layer 130 as shown in FIG. 15. The via 136 is advantageously formed by masking the layer 134 and anisotropic etching, using reactive ion etching, chemical plasma etching or other suitable anisotropic etching techniques. As shown in FIG. 16, following formation of the via 136, a layer 138 of the material selected for the gate electrode of the transistor 14 may then be deposited over the conductor layer 134, filling the via 136. Both of the layers 138 and 134 may then be planarized back to the tops of the spacers 52, 54, 98, 100, 102 and 104 as shown in FIG. 16 to yield the tungsten conductor layer 34 and the tungsten nitride conductor layer 74', as well as the completed transistors 13 and 14.

Another alternate exemplary process flow in accordance with the present invention may be understood by referring now to FIGS. 17 and 18. FIG. 17 is a cross-sectional view like FIG. 5 and depicts the processing up to the formation of the stacks, now designated 112', 114', 116' and 118'. FIG. 18 is a cross-sectional view like FIG. 8. Referring initially to FIG. 17, the stack 112' consists of an interim layer 140 that is formed on the substrate 12 and is patterned to provide an interim structure to facilitate the formation of the spacers 52 and 54 adjacent thereto. The stacks 114', 116' and 118' are similarly composed of interim layers 140 bracketed by the spacers 62 and 64, 98 and 100, and 102 and 104 respectively. The interim layers 140 may be composed of a variety of materials commonly used in semiconductor processing that may be etched selectively to the substrate 12. For example, the layers 140 may be composed of silicon dioxide, aluminum, tungsten, TEOS, or the like. In an exemplary embodiment, the interim layers 140 are composed of silicon dioxide and may be formed on the substrate 12 by CVD or thermal oxidation as desired. In an exemplary embodiment, the layers 140 may be established by thermal oxidation of the substrate 12 and subsequent patterning and anisotropic etching as described above generally in relation to FIGS. 2 and 3, albeit with a chemistry suitable for silicon dioxide, such as $CF_6$. Following formation of the layers 140, the spacers 52, 54, 62, 64, 98, 100, 102 and 104 may be established as generally described above and depicted in FIGS. 4 and 5.

The process flow may then proceed generally as described above and depicted in FIGS. 6 and 7 so that gate dielectric layers 26' and 66' are established on the substrate 12 and polysilicon layers 30' and 70' are established on the gate dielectric layers 26' and 66'. The interim layers 140 depicted in FIG. 17 may be removed by isotropic or anisotropic etching and replaced with silicide layers 142. The conformal deposition and anneal process will also establish silicide layers 142 on the polysilicon layers 30' and 70'. The process flow may then proceed as generally described above in conjunction with FIGS. 10, 11, 12, 13 and 14, or, alternatively, as depicted in FIGS. 15 and 16, to establish the contacts 42, 44, 76 and 78 depicted in FIGS. 1 or 16.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a transistor on a substrate, comprising the steps of:

forming a first stack on the substrate and a second stack on the substrate in spaced-apart relation to the first stack, the first stack having a first layer and first and second spacers adjacent to the first layer, the second stack having a second layer and third and fourth spacers adjacent to the second layer;

forming a gate dielectric layer on the substrate between the first and second stacks;

forming a first conductor layer on the gate dielectric layer;

forming a first source/drain region beneath the first layer and a second source/drain region beneath the second layer; and removing the first and second layers and forming a first contact on the first source/drain region and a second contact on the second source/drain region.

2. The method of claim 1, wherein the step of forming the first and second stacks comprises forming a layer on the substrate, and masking and etching the layer to define the first and second layers.

3. The method of claim 2, wherein the step of forming the layer on the substrate comprises forming a layer of silicon dioxide on the substrate.

4. The method of claim 1, wherein the step of forming the first and second stacks comprises depositing a layer of silicon nitride on the first and second layers and anisotropically etching the layer of silicon nitride to define the first, second, third and fourth spacers.

5. The method of claim 1, wherein the step of forming the gate dielectric layer comprises forming a layer of $SiO_2$, $Ta_2O_5$ or $Si_3N_4$.

6. The method of claim 1, wherein the step of forming the first conductor layer comprises forming a layer of polysilicon, tantalum, titanium, tungsten, aluminum, or copper.

7. The method of claim 1, wherein the step of forming the first conductor layer comprises forming a layer of polysilicon.

8. The method of claim 7, wherein the step of forming the layer of polysilicon comprises depositing polysilicon and planarizing the polysilicon to the tops of the first, second, third and fourth spacers by chemical mechanical polishing.

9. The method of claim 7, comprising the step of removing a portion of the first conductor layer to reduce the thickness thereof.

10. The method of claim 9, wherein the step of forming the first and second contacts comprises forming a layer of silicide between the contact and the substrate, the suicide layer also coating the first conductor layer.

11. The method of claim 1, wherein the step of forming the first and second source/drain regions comprises implanting a dopant species into substrate between the first and second spacers and between the third and fourth spacers, and annealing the substrate.

12. The method of claim 1, wherein the step of forming the first and second contacts comprises forming an adhesion layer on the opposing sidewalls of the first and second and third and fourth spacers and forming a second conductor layer on the adhesion layer.

13. The method of claim 11, wherein the second conductor layer comprises tungsten.

14. A method of fabricating a transistor on a substrate, comprising the steps of:

forming a first stack on the substrate and a second stack on the substrate in spaced-apart relation to the first stack, the first stack having a first conductor layer on the substrate, a second layer on the first conductor layer, first and second spacers adjacent to the first conductor layer and the second layer, the second stack having a second conductor layer on the substrate, a third layer on the second conductor layer and third and fourth spacers adjacent to the second conductor layer and the third layer;

forming a gate dielectric layer on the substrate between the first and second stacks;

forming a third conductor layer on the gate dielectric layer;

forming a first source/drain region beneath the first conductor layer and a second source/drain region beneath the second conductor layer; and removing the second and third layers and forming a fourth conductor layer on the first, second and third conductor layers.

15. The method of claim 14, comprising the step of removing a portion of the third conductor layer to reduce the thickness thereof.

16. The method of claim 14, wherein the step of forming the first and second conductor layers comprises forming first and second titanium layers.

17. The method of claim 14, wherein the step of forming the first and second conductor layers comprises forming first and second tungsten layers.

18. The method of claim 14, wherein the step of forming the second layers comprises forming first and second silicon dioxide layers.

19. The method of claim 14, wherein the step of forming the first and second stacks comprises depositing a layer of silicon nitride on the first and second layers and anisotropically etching the layer of silicon nitride to define the first, second, third and fourth spacers.

20. The method of claim 14, wherein the step of forming the gate dielectric layer comprises forming a layer of $SiO_2$, $Ta_2O_5$ or $Si_3N_4$.

21. The method of claim 14, wherein the step of forming the third conductor layer comprises forming a layer of polysilicon, tantalum, titanium, tungsten, aluminum, or copper.

22. The method of claim 14, wherein the step of forming the third conductor layer comprises forming a layer of polysilicon.

23. The method of claim 22, wherein the step of forming the layer of polysilicon comprises depositing polysilicon and planarizing the polysilicon to the tops of the first, second, third and fourth spacers by chemical mechanical polishing.

24. The method of claim 22, comprising the step of removing a portion of the first conductor layer to reduce the thickness thereof.

25. The method of claim 14, wherein the step of forming the first and second contacts comprises forming a layer of silicide between the contact and the substrate, the silicide layer also coating the first conductor layer.

26. The method of claim 14, wherein the step of forming the first and second source/drain regions comprises implanting a dopant species into substrate between the first and second spacers and between the third and fourth spacers, and annealing the substrate.

27. The method of claim 14, wherein the step of forming the first and second contacts comprises forming an adhesion layer on the opposing sidewalls of the first and second and third and fourth spacers and forming a second conductor layer on the adhesion layer.

\* \* \* \* \*